United States Patent [19]

Bartlett et al.

[11] 4,277,321

[45] * Jul. 7, 1981

[54] TREATING MULTILAYER PRINTED WIRING BOARDS

[75] Inventors: Charles J. Bartlett, Madison; Ronald J. Rhodes, South Plainfield; Ray D. Rust, Berkeley Heights, all of N.J.

[73] Assignee: Bell Telephone Laboratories, Incorporated, Murray Hill, N.J.

[*] Notice: The portion of the term of this patent subsequent to Oct. 28, 1997, has been disclaimed.

[21] Appl. No.: 113,117

[22] Filed: Jan. 17, 1980

Related U.S. Application Data

[63] Continuation-in-part of Ser. No. 32,339, Apr. 23, 1979, Pat. No. 4,230,553.

[51] Int. Cl.³ .............................................. C23C 15/00
[52] U.S. Cl. ................................. 204/192 E; 29/852; 156/643; 156/644
[58] Field of Search ................ 29/852, 857; 174/68.5; 204/192 EC, 192 E; 156/643, 644

[56] References Cited

U.S. PATENT DOCUMENTS 4,012,307   3/1977   Phillips .............................. 204/192 E

OTHER PUBLICATIONS

J. L. Vossen, Glow Discharge Phenomena in Plasma Etching and Plasma Deposition, *J. Electrochem. Soc.*, Feb. 1979, pp. 319-324.

*Primary Examiner*—Delbert E. Gantz
*Assistant Examiner*—William Leader
*Attorney, Agent, or Firm*—Peter V. D. Wilde

[57] ABSTRACT

Multilayer printed wiring boards are conventionally laminated using epoxy adhesives. When the boards are drilled, a residual smear often remains within the drilled holes. This smear prevents proper through plating of the holes and the layers are left without some of the intended interconnections. In the past, the residual smear was removed by wet etching. A technique is described using plasma etching with the conductive surface layers of the drilled boards as the electrodes to generate the plasma. The plasma forms directly within the holes and effectively removes the smear. A dielectric material in contact or close proximity to the perimeter of each board provides uniformity of treatment over the panels.

4 Claims, 11 Drawing Figures

TREATING MULTILAYER PRINTED WIRING BOARDS

CROSS-REFERENCE TO RELATED APPLICATION

This application is a continuation-in-part of my copending application, Ser. No. 32,339, filed Apr. 23, 1979, now U.S. Pat. No. 4,230,553.

BACKGROUND OF THE INVENTION

Multilayer printed wiring boards have added valuable new dimensions to printed circuit design. The design freedom resulting from the added crossover capability creates more compact and efficient packaging of complex circuits than is possible with the conventional two-sided board. Interconnection between levels, however, has also become a more complex problem than the simple plated-through interconnections on a single two-sided printed circuit board. A persistent difficulty is the smearing of the adhesive and dielectric that occurs when the multilayer board (MLB) is drilled. Smeared adhesive and dielectric materials that coat the sidewalls of the drilled holes prevent proper electrical contact between inner conducting layers when the holes are through-plated.

This problem is addressed by U.S. Pat. No. 4,012,307. The solution proposed there is to clean the holes, before plating, using a gas plasma cleaning technique. The plasma technique is represented to be superior in several respects to the chemical etching technique used earlier to attack the same problem.

We have verified that the use of plasma etching to remove adhesive and dielectric smear from the sidewalls of the holes in multilayer printed wiring boards does indeed have merit. We have found, however, that the process taught by the patent just mentioned can be improved upon significantly. That improvement is the subject of this patent.

According to the prior art, multilayer boards having holes with sidewalls coated with unwanted dielectric material are treated in a plasma chamber. The plasma formed within the chamber etches away the dielectric material and other contaminants. However, we have found that the use of the plasma chamber, according to the teachings of the prior art, leads in many cases to incomplete or ineffective removal of the dielectric material. We have determined that the major problem with the prior art etching system is the unreliable nonuniform and inefficient penetration of the plasma to the walls within the holes.

This realization led us to investigate a more efficient plasma configuration in which the plasma is shaped to the configuration of the boards through the use of a parallel plate electrode geometry. The advantages of this approach over the plasma chamber of the prior art (using ring electrodes mounted outside the cylindrical chamber) are the relatively short diffusion path from the electrodes to the MLB, the uniformity of the concentration of the etching gas over the surface of the MLB, and the greater control over the gas flow rate over that surface.

Experiments with the parallel plate configuration were promising and indicated that development along these lines would likely produce results superior to those obtained with the unshaped plasma of the plasma chamber. However, we were unsatisfied with our results using the parallel plate configuration. In several etching attempts, residual dielectric material still remained within the holes of the MLB after the plasma treatment.

SUMMARY OF THE INVENTION

We then devised a further modification that is the subject of this invention. That modification is to utilize the boards themselves as the electrodes to generate the plasma and to confine and shape the plasma to the board. This change we found to be very substantial in terms of the effectiveness and uniformity of the process. The plasma, in this case, penetrates effectively and uniformly within the holes of the MLB, facilitating the cleaning operation.

DETAILED DESCRIPTION

Figure 1:
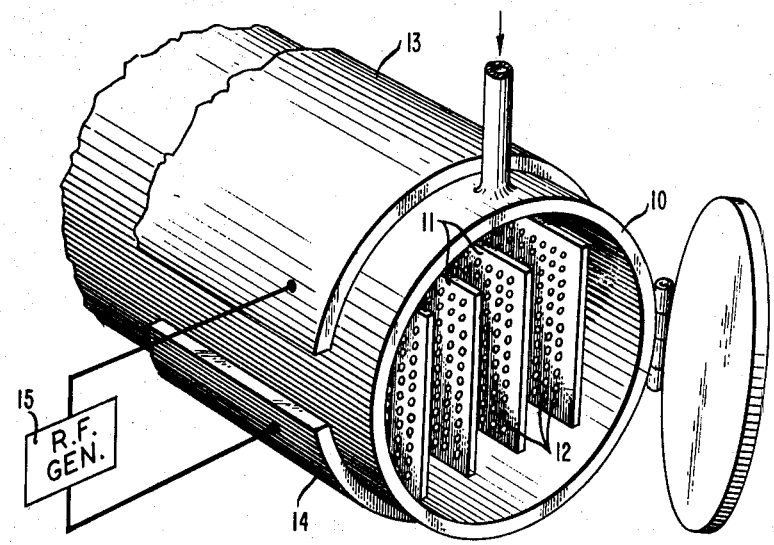
FIG. 1 is a schematic representation of a typical plasma apparatus used for cleaning printed wiring boards by the method of the prior art, showing a plasma chamber containing an unshaped plasma.

A plasma chamber having the generalized design of those used in connection with the prior art methods for cleaning through-holes in a MLB is shown in FIG. 1. The plasma chamber is shown at 10, with the drilled boards 11 contained within the chamber. The drilled holes are indicated at 12, and are the focus of the process. The chamber is sealed and pumped down, then back-filled with an etching gas to a total pressure on the order of 0.05 to 100 torr. The plasma is formed by RF generator 15 operating via electrodes 13 and 14. The plasma essentially fills the chamber 10, enveloping the boards 11. Other electrode arrangements are known and have been used to generate plasmas within a plasma chamber, such that the plasma essentially fills the chamber and envelopes anything placed within the chamber. Aluminum plasma chambers are used in this connection with the chamber wall functioning as one electrode and the other electrode formed by a foraminous cylinder within the chamber. The plasma that forms between the electrodes penetrates the foraminous cylinder and contacts the printed wiring boards disposed within the cylinder.

Results of many tests with equipment of this general nature established that plasma processing of this kind does remove smeared dielectric material from the drilled holes. However, in most cases the removal is incomplete and nonuniform leaving residual dielectric. From a functional standpoint, incomplete etching is essentially the same as no etching. Therefore, this plasma etching process is regarded as unsatisfactory.

Figure 2:
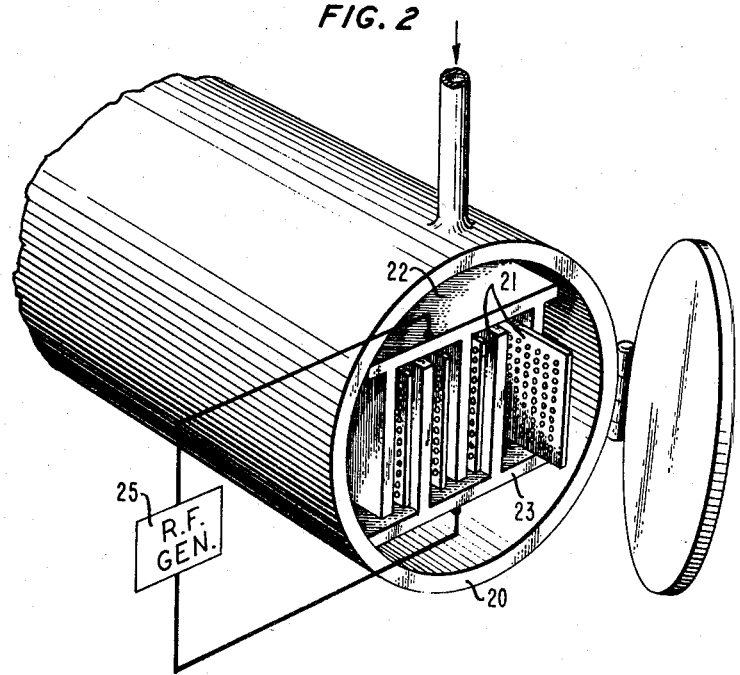
FIG. 2 is a similar schematic representation of a modified apparatus using a plasma shaped to the configuration of the workpieces being processed using a parallel electrode configuration.

The apparatus shown in FIG. 2 facilitates a plasma technique that gives improved etching. Here the chamber 20 is similar to the chamber in FIG. 1 (except that it can be of a conducting or nonconducting material and typically is aluminum) without the external RF electrodes. The predrilled boards 21 are disposed within the chamber with each board placed between RF electrodes 22 and 23 as shown. This parallel plate electrode arrangement shapes the plasma and confines it to the boards. The penetration of the plasma within the drilled holes is enhanced as compared with the arrangement of FIG. 1.

Considerable experience was obtained using this arrangement. Experiments comparing the two, established that the parallel plate configuration gives more reliable etching results than we had obtained with the unshaped plasma. The MLB dielectric was a standard epoxy resin used in commercially available products. We believe that results, at least qualitatively equivalent to those reported here, are obtainable with other dielectric materials, such as acrylic and polyimide. The etching gas used in most of our experiments was an $O_2/CF_4$ mixture in the range of 20 to 60 vol. percent $CF_4$, although other plasma gases can be used as well. Gas pressures in the range of 0.10 to 0.20 torr gave satisfactory results. We expect that the pressure can be varied under appropriate conditions over a wider range of 0.05 to 100 torr. We found it desirable to raise the temperature of the boards in excess of 95 degrees C. to enhance the etch rate. Adjustment of the RF power may also be required so as not to overheat the boards.

Our experiments with the parallel plate arrangement showed the process to be useful but not optimum. Instances of incomplete and nonuniform etching occurred often enough to suggest further improvement.

Figure 3:
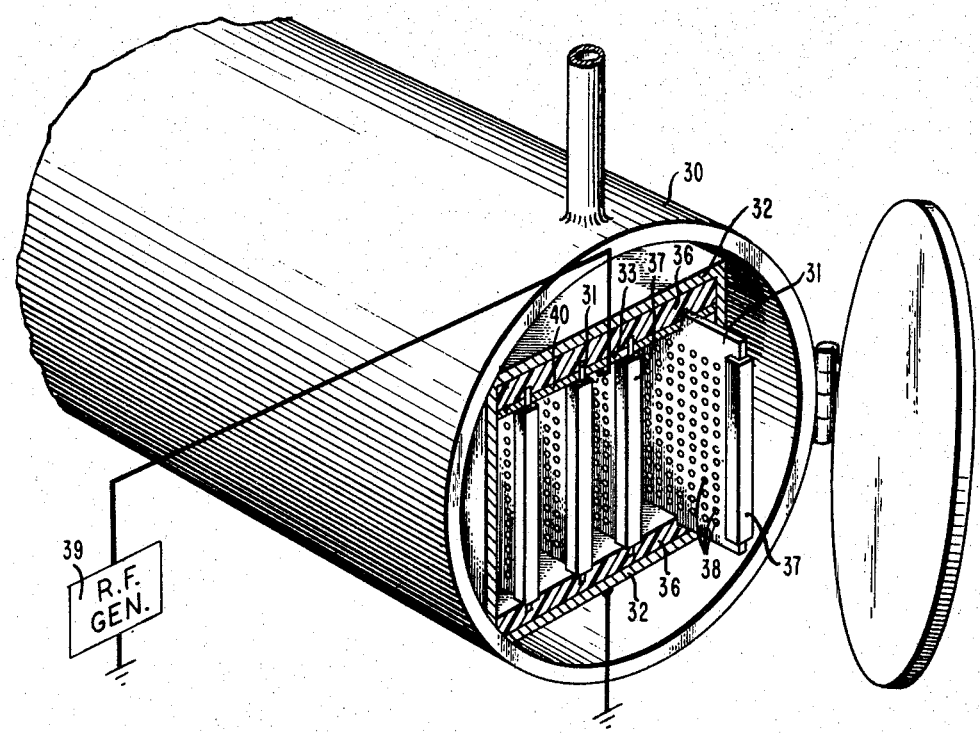
FIG. 3 is a schematic representation similar to those of FIGS. 1 and 2 showing the method for forming the plasma according to this invention.
Figure 5:
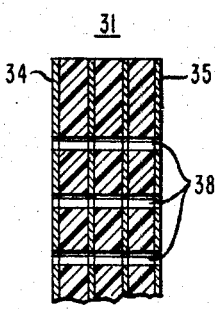
FIG. 5 is a sectional view of one of the multilayer wiring boards shown in FIGS. 1 to 3.

That improved technique was realized with the arrangement shown in FIG. 3. Here the multilayer boards 31 are shown supported within electrode 32 in the chamber 30. The boards are arranged in slots of insulating spacers 36 so that the RF electrode 33 contacts the copper or conductive sheet 34 (FIG. 5) on one side of the board, and intermediate RF electrode 40 contacts the conductive sheet 35 (FIG. 5) on the other side of the board. Similarly the intermediate RF electrode 40 contacts the conductive sheet 34 of the next MLB and electrode 32 contacts the conductive sheet 35 on the other side of the board. A dielectric material used as an electric field suppressor (DFS) 37 is positioned at the front and rear edge of each board as well as the top and bottom of each board (36) to further confine and shape the plasma to the board. These dielectric field suppressors improve the uniformity and completeness of etching over the entire board. The RF generator 39 or other power supplies such as direct current, alternating current, or pulsed direct current is used to excite the plasma which is generated between the conductive surface layers 34 and 35 of each board and extends directly into the holes 38. This arrangement is attractive because the plasma is formed precisely in the places to be etched.

Figure 4:
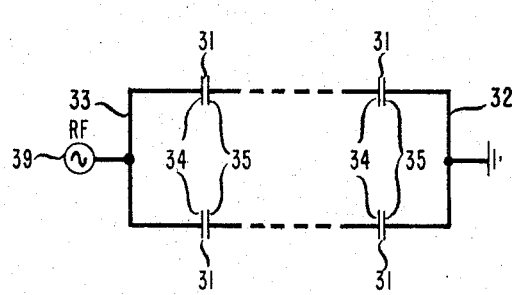
FIG. 4 is a schematic circuit diagram illustrating the electrical arrangement for interconnecting the printed wiring boards to the RF generator.

The electrical arrangement shown for contacting the conductive surface layers of the boards is convenient for purposes of illustration. Additional boards may be added in a series-parallel electrical configuration as shown in FIG. 4.

Alternatively a straight series arrangement or a straight parallel arrangement may be used with appropriate and straightforward modifications of the apparatus. The arrangement shown has important advantages. For example, the two outside printed wiring boards have the outer surface at the same potential and therefore can be connected directly to the grounded container 32.

Other arrangements, equally or perhaps more effective, can be devised. For example, it may be found useful to provide conductive tracks for both the upper and lower edge of each conductive sheet. The materials used also allow for wide variation. Metallic spring electrical contacts may be used to aid in loading and unloading the boards. Various gas flow arrangements will be devised for use in connection with the equipment shown. We have found it useful to partition the chamber with a baffle so the gas entering the chamber flows through the actual treatment chamber such that the flow of gas around the element 32 is prevented.

Experience with plasma cleaning of multilayer wiring boards using a plasma created between the conductive sheets of the boards as RF electrodes has been substantial and highly successful. With this arrangement, heating is more efficient, and less board warpage has been encountered. Etching is consistently more effective and uniform than with the parallel plate arrangement, which in turn is more effective and uniform than the unshaped plasma-filled chamber. The etching conditions used are essentially those described in connection with the parallel plate electrode configuration experiments. The following specific embodiment sets forth conditions that we found give advantageous results.

The following is an illustrative examlple of processing four epoxy-glass MLBs simultaneously. The boards are supported within the vacuum chamber with an RF electrode attached to each copper surface sheet as shown in FIG. 3. The four boards are preheated to 80 degrees C. A vacuum is pulled to 0.00 torr, and a 50/50 mixture of $CF_4/O_2$ is added to a total pressure of 0.100 torr. The RF generator power is adjusted to 1500 watts, and the boards are processed for 60 minutes. The power and gases are turned off, the system purged to atmospheric pressure, the fumes exhausted from the chamber and the boards are removed.

This sequence is exemplary only. Others can be devised to give adequate results. This sequence has been used to effectively remove all smear from epoxy glass multilayer boards. Slight adjustments might be expected to accommodate other MLB materials and other physical arrangements that use the MLB surface electrodes to create, or assist in creating, the plasma.

For epoxy-glass multilayer boards we recommend the following conditions:

| Parameter | Range | Typical |
| --- | --- | --- |
| total pressure | 0.05 to 0.400 torr | 0.100 torr |
| temperature | 20 to 175 degrees C. | 95 to 150 degrees C. |
| gas | 20/80 to 80/20 $CF_4/O_2$ | 50/50 $CF_4/O_2$ |
| input power (watts/board surface area) | 0.014 to 0.341 watts/cm$^2$ | 0.068 watts/cm$^2$ |
| etching time | 5 minutes to 2 hours | 45 minutes |

We have described a process for etching drilled boards that have conductive surface layers on both sides of the board. One can foresee multilayer boards that have one or even both surfaces of insulating material, that is, with all of the conductive layers in the interior of the board. Such structures can be treated in accordance with the technique of this invention by providing electrical contacts to any two of the interior layers.

We have also found that when treating two or more panels at one time it is not essential, or in some cases is not even desirable, to make electrical connection to each surface of every panel. We have found that the electrical interconnection arrangements shown in FIGS. 6–10 can be used as alternatives to that shown in FIG. 4.

Figure 6:
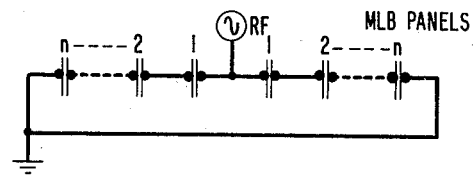
FIGS. 6 through 10 are schematic electrical arrangements for interconnecting the panels pursuant to the treatment of the invention.
Figure 7:
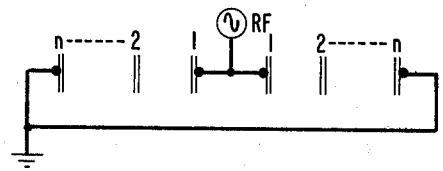
Figure 8:
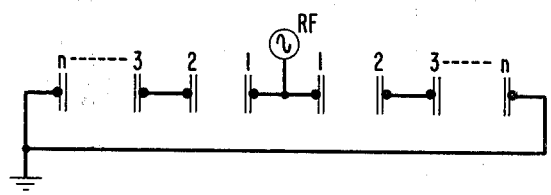
Figure 9:
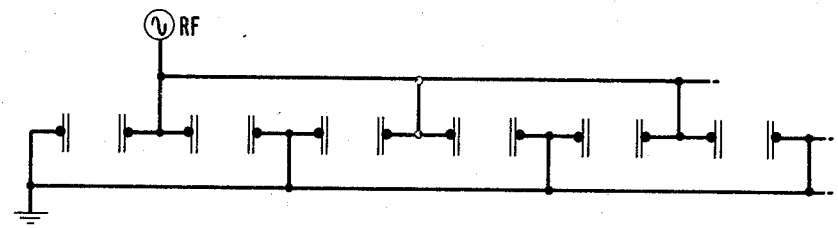
Figure 10:
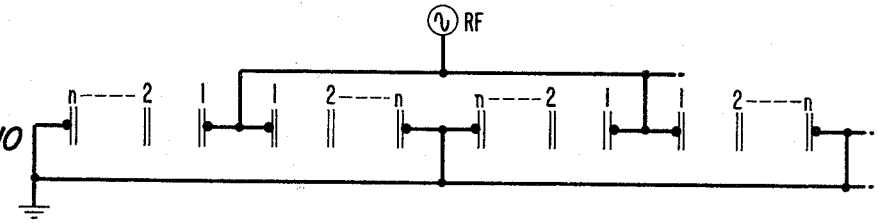

FIG. 6 described schematically an electrical interconnection similar to that of FIG. 4 for "n" panels, showing the first, second, and nth panel as capacitors. In FIG. 7 electrical connections are made only to the outside layers of the first and last panels. In FIG. 8 a connection between two subsequent panels is added, indicating one or more regions between panels that are actually contacted and one or more regions where there is no connection. FIGS. 9 and 10 show arrangements where some of the panel layers are electrically contacted and some are not, with some of the connections made to ground and others to the RF source. The interconnection of FIG. 10 will be recognized as the arrangement of FIG. 7, duplicated with the two parts connected in parallel with the RF source.

We have also used successfully an electrical arrangement wherein the grounded surface electrode is isolated from the holder. The ground connection is made through a strap bolted to the chamber. This arrangement is also regarded as an alternative practice as both arrangements described work well for some applications.

The electrical arrangement shown in FIG. 7, with n equal to 2, was found to be particularly effective. It was found to reduce the sensitivity of the RF field distribution to geometry changes in the apparatus, e.g., the choice of grounding arrangement, the length of the grounding strap, etc. This configuration was found also to produce regions of bright and dark plasma. Bright regions correspond to areas between panels where there is no electrical connection to the panel surface. Dark regions correspond to areas between panels where there is electrical connection to the surfaces. The bright regions are at a higher pressure than the dark regions, producing a pressure difference across the panels, and through the holes, causing the gas to flow through the holes and improving thereby the etching of the surface within the holes.

We also found that when using this electrical arrangement the panels etch better at higher pressure, and we recommend pressures in the range of 0.4 torr to 1.5 torr. At these higher pressures, temperature uniformity over the panel surface may be varied by adjusting the pressure. For example, we have found that at 0.4 torr the center of the panel heats more rapidly than the front or back edges of the panel. At 0.2 torr the front and back heat more rapidly than the middle. In our experience, the most difficult part of the panel to etch is the middle. Therefore we have found it advantageous to adjust the pressure so that the center of the panel is at least as hot as the front and back of the panel.

We have also found that the power levels needed to etch effectively with this arrangement are less than those used with the arrangement described earlier. Power was reduced from approximately 1500 watts to an average of approximately 500 to 800 watts (for four panels).

We have observed plasma plumes extending from certain of the holes under some conditions, which implies greater power density in those holes and more rapid etching. For uniform etching therefore we recommend that the plumes be eliminated. The elimination of plumes can be achieved either by reducing the power to a value below that at which plumes form or by increasing the operating gas pressure. However, we recognize that situations may arise where selective etching, or faster etching in some openings, may be useful, at which time conditions may be adjusted to promote pluming.

Figure 11:
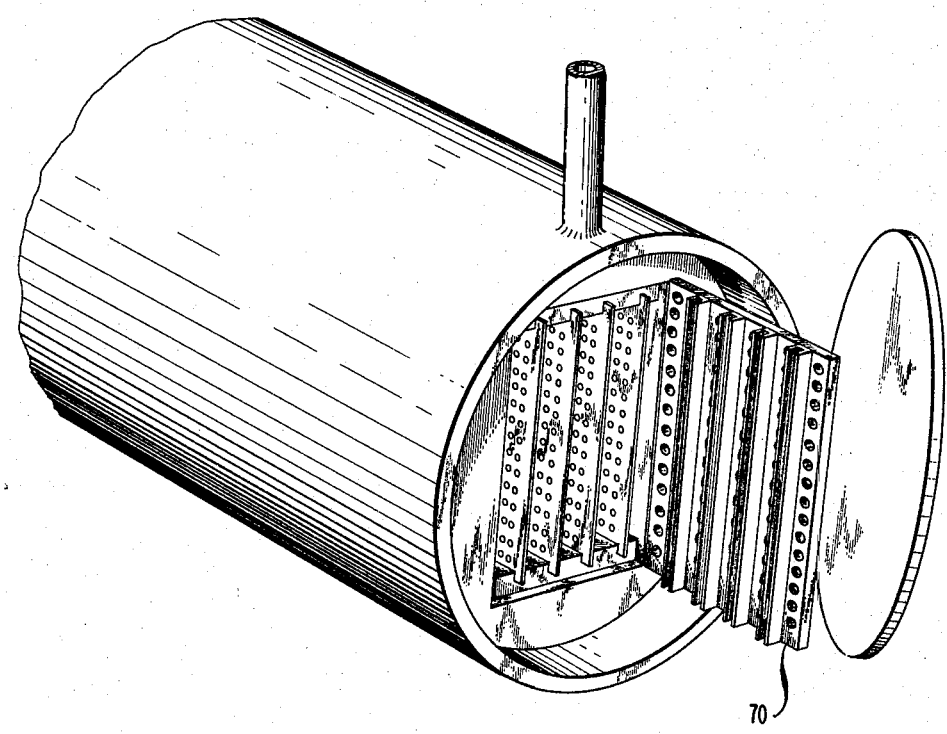
FIG. 11 is a perspective view of a combined cover and dielectric field suppressor.

The most advanced version of our plasma processing chamber that we have built to date employs the dielectric field suppressors (DFS) mentioned earlier. We continue to believe that this is especially advantageous in shaping the plasma density within the chamber to the desired regions. The dielectric field suppressors are conveniently incorporated into a fixed bracket or "door" shown at 70 in FIG. 11. The door may be hinged to the left, right, top or bottom, and in this embodiment is perforated as shown to facilitate gas flow. Other gas flow arrangements can be designed. It is evident that this arrangement facilitates loading and unloading of the panels. This kind of approach is particularly useful as the apparatus is scaled to accommodate larger numbers of panels.

In connection with FIGS. 6–10, it will be understood that the panels being treated are arranged similarly to the arrangement shown in FIGS. 1–3. It is evident that the panels can be stacked in any attitude from horizontal to vertical. Spacing between the parallel faces of the boards depends on the electrical conditions, but in our experience one or two inches is typical.

Various additional modifications and deviations of this invention will occur to those skilled in the art. All such variations that rely essentially on the teachings through which this invention has advanced the art are properly considered to be within the scope of this invention.

We claim:

1. A process for treating a laminated structure having metal layers separated by an insulating layer, and holes therethrough, comprising the steps of placing the structure in a partially evacuated chamber containing a gas comprising oxygen, making electrical contact to at least some of the metal layers, and applying an electric field to the contacts so as to create a gas plasma that extends into the holes.

2. The process of claim 1 in which several structures are stacked for simultaneous treatment with the structures spaced from one another and arranged with their planar faces essentially parallel, and electrical connection is made to selected structures in the stack.

3. The process of claim 1 in which the chamber is evacuated to a pressure of 0.4 to 1.5 torr.

4. The process of claim 1 in which the chamber is evacuated to a presure of 0.05 to 1.5 torr.

* * * * *